United States Patent [19]

Frey, Jr. et al.

[11] Patent Number: 4,535,386
[45] Date of Patent: Aug. 13, 1985

[54] NATURAL CONVECTION COOLING SYSTEM FOR ELECTRONIC COMPONENTS

[75] Inventors: Sydney W. Frey, Jr., Brookfield; Mark I. Herson, South Milwaukee, both of Wis.

[73] Assignee: Allen-Bradley Company, Milwaukee, Wis.

[21] Appl. No.: 497,099

[22] Filed: May 23, 1983

[51] Int. Cl.³ .............................................. H05K 7/20
[52] U.S. Cl. ................................ 361/389; 165/104.33; 174/16 R; 361/381
[58] Field of Search ............... 361/380, 381, 382, 383, 361/384, 389; 174/15 R, 16 R, 16 HS; 165/124, 129, 128, 146, 80 B, 80 D, 185, 76, 104.34, 104.33, 130, 131, 47, 183; 357/80, 81

[56] References Cited

U.S. PATENT DOCUMENTS

| | | |
|---|---|---|
| 1,671,188 | 5/1928 | Gauss . |
| 1,859,056 | 5/1932 | Seelert ................................ 165/129 |
| 2,187,011 | 1/1940 | Braden .................................... 62/80 |
| 2,348,020 | 5/1944 | Norris ................................. 257/245 |
| 2,654,583 | 10/1953 | Treanor ............................... 257/191 |
| 2,696,369 | 12/1954 | Morley et al. ....................... 165/129 |
| 2,828,946 | 4/1958 | Smith .................................. 257/216 |
| 2,912,624 | 11/1959 | Wagner ............................... 317/100 |
| 3,226,602 | 12/1965 | Elfving ............................... 317/100 |
| 3,310,652 | 3/1967 | Williams ............................. 165/129 |
| 3,317,798 | 5/1967 | Chu et al. ........................... 165/122 |
| 3,396,780 | 8/1968 | Koltuniak et al. ..................... 165/47 |
| 3,397,440 | 8/1968 | Dalin .................................. 165/183 |
| 3,744,559 | 7/1973 | Overholt ............................ 165/80 B |
| 3,749,981 | 7/1973 | Koltuniak et al. .................... 317/100 |
| 3,912,003 | 10/1975 | Schrade .............................. 165/165 |
| 3,940,665 | 2/1976 | Seki .................................... 361/383 |

FOREIGN PATENT DOCUMENTS 2744664 4/1979 Fed. Rep. of Germany ...................... 165/104.33

OTHER PUBLICATIONS

U.S. patent application Ser. No. 379,179 "Heat Exchanger for Industrial Control Enclosures" filed by Richard Bentley et al., May 17, 1982.

*Primary Examiner*—A. D. Pellinen
*Assistant Examiner*—Gregory D. Thompson
*Attorney, Agent, or Firm*—Barry E. Sammons

[57] ABSTRACT

Natural convection cooling of power carrying electronic components mounted within an enclosure is achieved by mounting the power components at the base of the enclosure at the opening of an inner chimney which separates the enclosure interior into forward and rearward compartments. The inner chimney serves to duct the heated air rising from the components at the base of the enclosure forward compartment to the top of the enclosure. A heat exchanger is mounted on the inside face of the enclosure door to provide a cooled surface so that warm air at the top of the enclosure forward compartment is drawn downwardly along the heat exchanger surface to the base of the enclosure thereby creating natural air turbulence within the enclosure. Natural convection cooling is further improved by adding a plurality of heat sinks to the chassis base so that the heat sink fins extend into the rearward compartment which forms an outer chimney by virtue of air ducts being provided in the front and top walls of the enclosure in communication of the rearward compartment. The outer chimney creates an increased draft of cool air along the fins thereby reducing the average temperature of the air rising through the fins. In this way, convection cooling is achieved without the need for separate mechanical air handling equipment.

8 Claims, 6 Drawing Figures

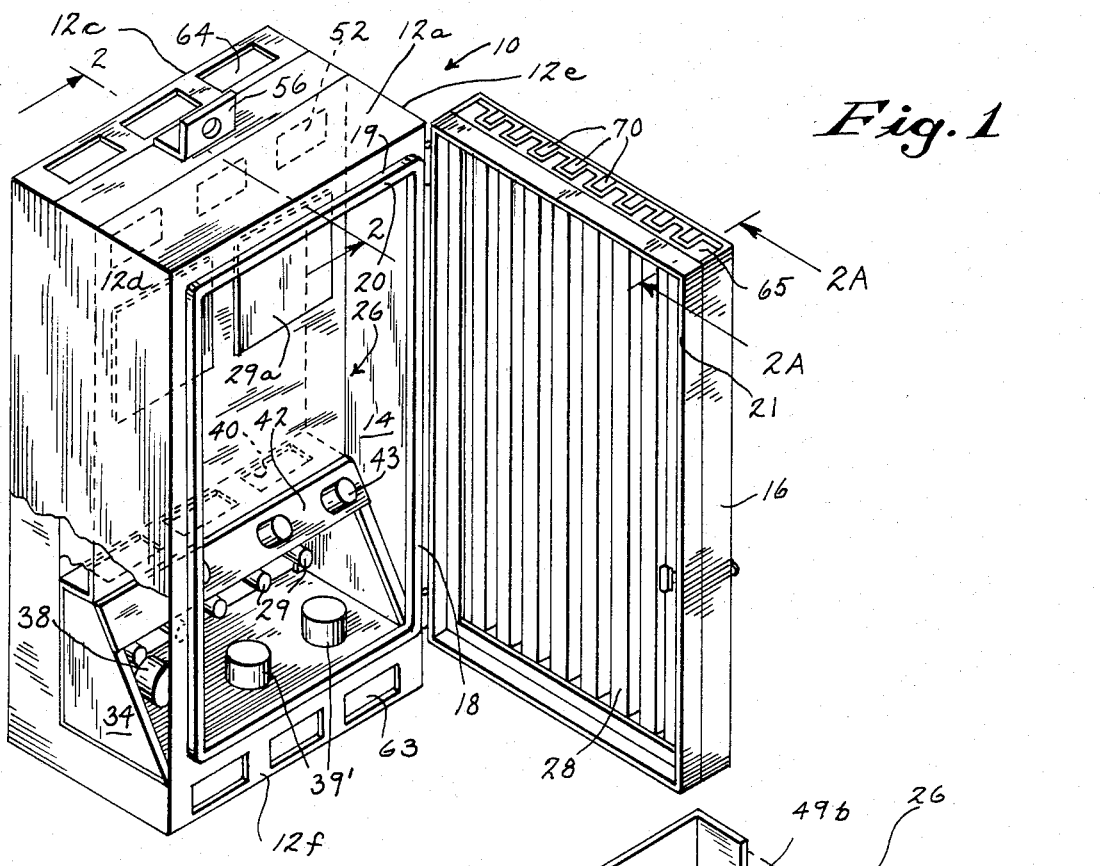
Fig. 1
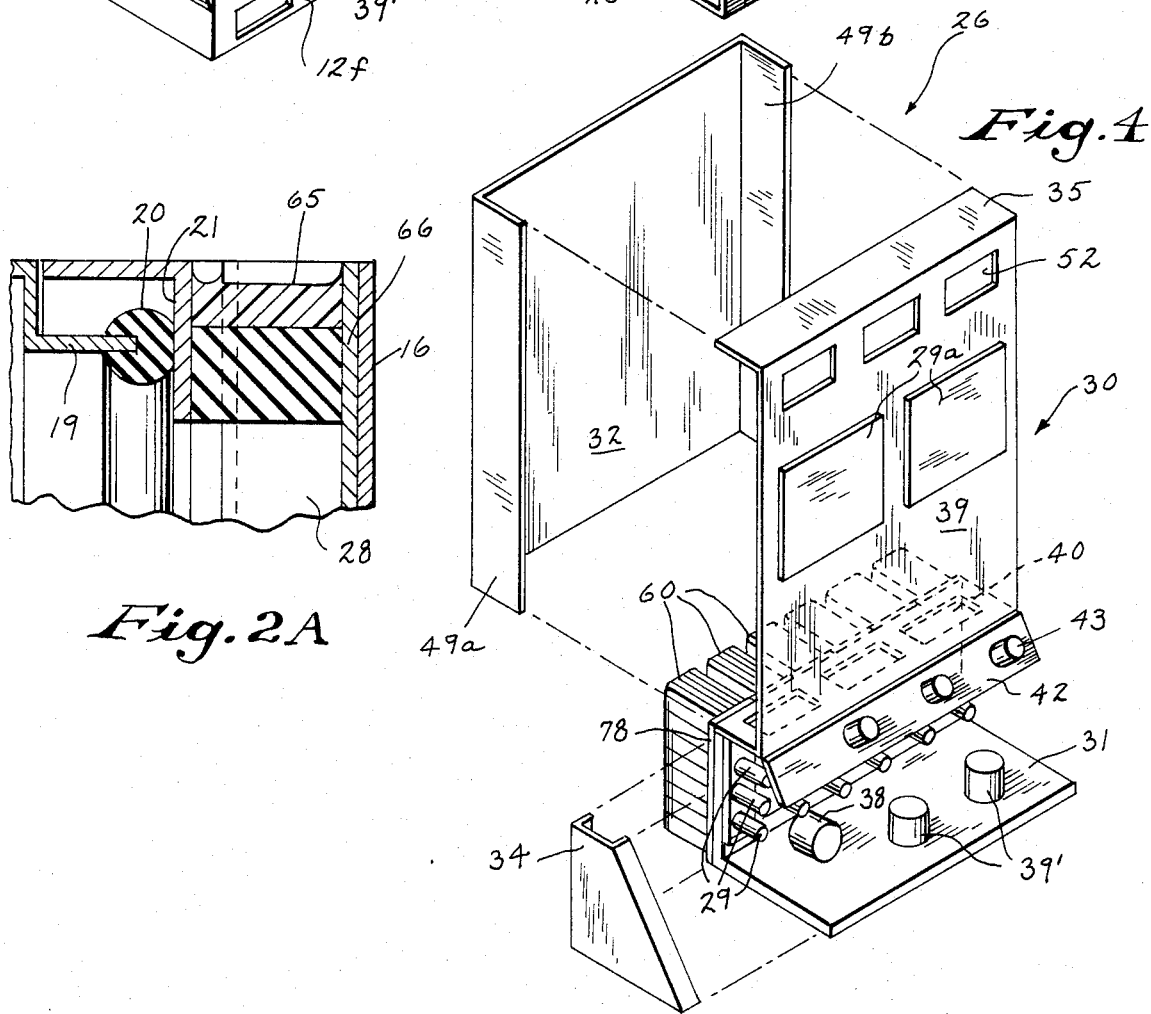
Fig. 2A
Fig. 4

NATURAL CONVECTION COOLING SYSTEM FOR ELECTRONIC COMPONENTS

FIELD OF THE INVENTION

The field of this invention is cooling systems for electronic components. More particularly this invention relates to a cooling system which cools electronic components by natural convection thereby eliminating the need for unreliable mechanical air handling equipment, such as blowers or fans.

In the design of enclosures for housing large, power carrying electronic components such as large silicon controlled rectifiers or the like, dissipation of the heat generated by the electronic components housed within the enclosure is a prime factor in the enclosure design. Failure to adequately provide for heat dissipation will likely lead to heat buildup which can lead to component failure. To avoid component overheating, the enclosure is typically vented at the bottom and top to create an air inlet and an air outlet, respectively. A fan or blower is provided for forcing air through the enclosure so that cool air enters the air inlet and heated air is exhausted from the enclosure through the air outlet.

The use of outside air for cooling the electronic components within the enclosure is only desirable however where the air is free from contaminants and corrosives, otherwise, circulating air containing contaminants and corrosives through the enclosure will likely cause deterioration and ultimate destruction of the electronic components housed therein. In industrial environments where contaminants and corrosives are present in the atmosphere, it is usually necessary to seal the enclosure to prevent leakage and thereby avoid contamination and deterioration of the components.

To extract the heat generated by the components within a sealed enclosure, either an air conditioner or a heat exchanger is employed. When an air conditioner is employed to extract the heat from a sealed electronic enclosure, the air conditioner evaporator and compressor are usually located outside of the enclosure while the air conditioner condenser and possibly a blower are located within the sealed cabinet. The heat generated by components within the cabinet is extracted via the air conditioner condenser and evaporator to the outside environment so as to prevent heat buildup within the enclosure. While air conditioning systems are very well suited for extracting heat from sealed electronic enclosures, air conditioners are not only very expensive to fabricate, as well as costly to operate, but also they are subject to breakdown.

Alternatively, heat exchangers, utilizing either air or water as a cooling medium have also been used to cool the power carrying electronic semiconductors disposed within a sealed enclosure. Heat exchangers using air as a cooling medium are commonly used in place of water heat exchangers because air heat exchangers are simpler, less costly to fabricate, and are not prone to leakage. In the past, to achieve good heat exchange with an air heat exchanger, some form of a fan or blower has utilized to circulate the air within the enclosure or through the heat exchanger to prevent heat buildup which could likely cause component failure. While the fabrication and operation costs of fans and blowers are not as great as air conditioners, nonetheless, the use of fans or blowers does present some difficulties. Firstly, unless the fan or blower motor is electrically filtered, the motor may generate undesirable electrical interference. Moreover should the fan or blower fail, then heat buildup within the enclosure would likely occur causing possible device overheating which could lead to device failure. For applications where the electronic components are to be left unattended for very long periods of time, it is generally desirable to have passive heat transfer. In the past, this has required very, very large heat exchangers.

BRIEF SUMMARY OF THE INVENTION

A natural convection cooling system for dissipating the heat rising from power electronic devices within a sealed structure includes an inner chimney located within the structure to duct heated air from the base of the enclosure where the devices are located to the top of the structure. A heat exchanger, located at the front of the enclosure, cools the heated air, causing it to sink to the enclosure bottom, thereby creating natural air turbulence within the enclosure.

In practice it is usually desirable to mount the power electronic devices to heat sinks which extend rearwardly through the walls of the enclosure, the enclosure openings being sealed by gaskets. To this end an improved staggered fin heat sink has been developed to achieve improved passive heat transfer at low air flow rates.

Greater dissipation of the heat radiated by the heat sinks is accomplished by locating the heat sinks at the base of an outer chimney which lies along the bottom and back of the enclosure. The outer chimney has intake openings at the bottom of the enclosure front and exhaust openings adjacent to the top rear of the enclosure to draw ambient air along the bottom and rear of the enclosure, to increase the air flow past the heat sinks by natural draft means, thereby increasing the heat transfer from the power electronic devices within the enclosure.

It is an object of the present invention to provide an improved cooling system for an electronic system which obviates the need for a separate fan or blower to circulate air. This is accomplished in the present invention by the combination of an inner chimney and a heat exchanger to circulate and cool the air inside the enclosure housing the electronic system. The inner chimney ducts the heated air rising from the electronic components within the enclosure to the top of the enclosure. The heat exchanger provides a cooled surface exposed to the enclosure interior for drawing the heated air at the top of the enclosure along the heat exchanger to the bottom of the enclosure. Natural air turbulence is thus created within the enclosure, obviating the need for any separate fans or blowers.

Another object of the present invention is to provide an improved heat sink mounted to the outside of the inner chimney. The improved heat sink has staggered fins to place an optimum number of leading edges into the air stream to maintain good turbulence across the full length of the heat sink without blocking the air flow.

A still further object of this invention is to provide an improved heat sink configuration with relatively long, closely spaced fins in staggered relationship for improved efficiency under natural convection conditions.

Yet another object of the present invention is to provide an outer chimney surrounding the heat sinks for ducting cool air past the heat sinks to improve heat sink heat dissipation.

Other objects and advantages of the present invention will become readily apparent from the following description.

BRIEF SUMMARY OF THE DRAWINGS

The features of the present invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 1 is a perspective view of the complete cooling system of the present enclosure, with the door shown open;

FIG. 2a is an enlarged view of a portion of FIG. 2 illustrating the details of the enclosure door and sealing gaskets;

FIG. 4 is an exploded view of the inner chimney structure of the cooling system of FIG. 1.

DETAILED DESCRIPTION OF THE PREFERRED EMBODIMENT

Figure 2:
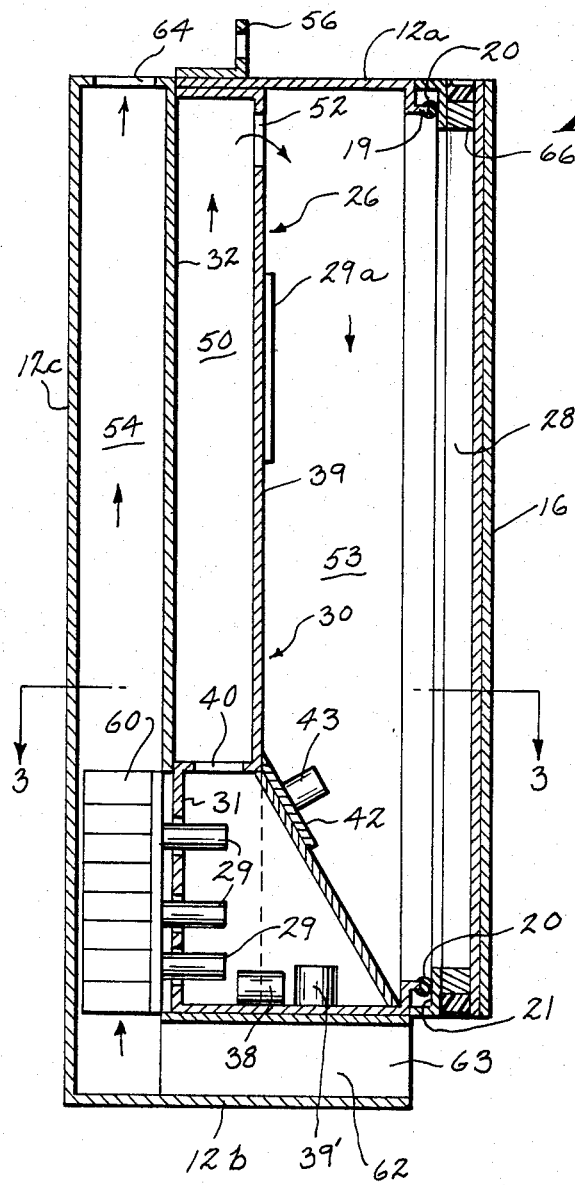
FIG. 2 is a cross sectional view of the cooling system of FIG. 1 taken along lines 2—2 thereof.
Figure 3:
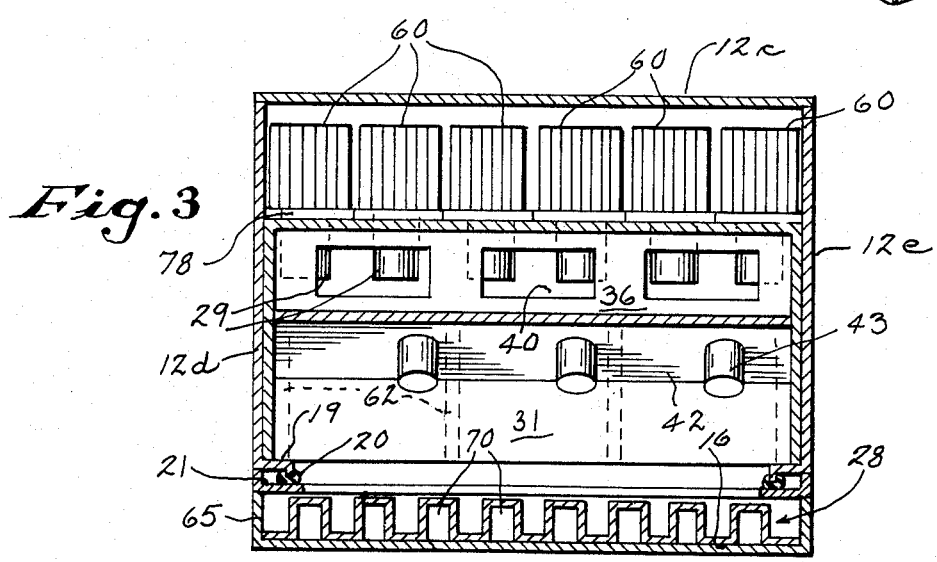
FIG. 3 is a cross sectional view of the cooling system of FIG. 2 taken along lines 3—3 thereof.

Referring now to FIGS. 1-3, an improved cooling system for convectively cooling electronic components and especially large power carrying electronic components such as silicon controlled rectifiers or the like comprises an enclosure 10. Enclosure 10 is constructed of a top wall 12a, a bottom wall 12b, a back wall 12c, a pair of side walls 12d and 12e and a front wall 12f. The front wall 12f is of a width equal to the width of back wall 12c but is of a much lesser height than the back wall 12c, so that an opening 14 is provided into the front of enclosure 10. In practice, walls 12a–12f are constructed of heat conductive material, such as sheet metal, and are joined to one another by welds or the like. Alternatively, enclosure 10 could be configured of a single sheet metal blank bent by a bending brake or the like.

The opening 14 into enclosure 10 is sealed by way of a door 16 secured to enclosure 10 by hinges 18. Like each of walls 12a–12f, door 16 is configured of a heat conductive material such as sheet metal or the like. In practice, it is desirable to achieve a leak resistant seal between door 16 and enclosure 10 when the door is shut to overlie opening 14. To achieve such a leak resistant seal, each of the top, side and front walls 12a, 12d, 12e and 12f of the enclosure 10 has a forwardly extending lip 19 overlying which is an elastomer gasket 20 (FIGS. 2 and 2a). Door 16 is provided with a flat, smooth, and continuous rearward face 21 adjacent to the door periphery, which serves to deform gasket 20 when door 16 is shut and thereby seal the enclosure.

Natural convection cooling of elctronic components, situated within enclosure 10 is accomplished by the combination of an inner chimney structure 26 mounted within enclosure 10 and a heat exchanger 28 mounted to the surface of door 16 which faces the enclosure interior when the door is shut. As will become better understood by a latter description of the inner chimney structure 26 and the heat exchanger 28, chimney structure 26 ducts heated air rising from the power electronic components 29, such as silicon controlled rectifiers which are situated at the base of the chimney structure, to the top of the enclosure. By ducting air to the top of the enclosure, the inner chimney 26 serves to keep the rising hot air away from control electronics circuitry 29a mounted above the power electronic components 29 and also helps to boost air circulation in the enclosure due to the natural draft effect created thereby. The heat exchanger 28 provides a cooled surface within the interior of enclosure 10 to cool the heated air as it sinks downwardly from the top of the enclosure along the surface of the heat exchanger to the base of the chimney structure 26, thereby further boosting air circulation by creating natural air turbulence within the enclosure. Increased air circulation velocity improves heat transfer through the enclosure walls and the heat exchanger.

Referring now to FIG. 4, which is an exploded view of the inner chimney structure 26, the inner chimney structure 26 is configured of an upper chassis 30, a lower chassis 31, a back plane 32 and a pair of gussets 34 (only one of which is shown). The upper chassis 30 is configured of a rectangular sheet of metal which is formed (bent) to have an upper and lower rearwardly extending flanges 35 and 36, respectively. The forward face 39 of the upper chassis 30 mounts the control electronics 29a 1 so that the control electronics are located well away from the power electronic components 29 which, as will be described hereinafter, are mounted the lower chassis 31.

The lower chassis 31 takes the form of an "L" shaped metal channel whose vertical and horizontal legs are each thicker than the thickness of upper chassis 30. This is because the vertical leg of the lower chassis 31 carries the power electronic component 29 and their associated heat sinks (described hereinafter) while the horizontal leg of the lower chassis may, for example, carry one or more inductors 38 and capacitors 39'. As will be appreciated following a further description of the mating of the back plane 32 with the uper chassis 30, the inductors and capacitors are mounted on the horizontal leg of the lower chassis 31 so that they are located forwardly of the vertical leg of the lower chassis and away from the heat rising from the power electronic components 29.

Lower chassis 31 is joined at the upper end of its vertical leg to the rearward edge of the flange 36 of the upper chassis 30 by welding so that the power electronic components 29 mounted by the vertical leg of chassis 31 lie beneath openings 40 in the flange 36. The heat dissipated by the power electronic components 29 rises upwardly through openings 40 and behind the forward face 39 of the upper chassis which mounts the control electronics 29a. Each of gussets 34 is fastened, typically by welding, to both the bottom flange 36 and to the vertical and horizontal legs of the lower chassis 31 to impart greater strength to the connection between the upper chassis 30 and the lower chassis 31. A sloping panel 42 is connected between the gussets 34 to further increase the rigidity of the structure formed by the upper and lower chassis. In addition, the sloping panel 42 also serves to mount one or more of power transistors 43 as well as to divert the heated air rising from the power electronic components 29 through openings 40 in the lower flange 36 of the upper chassis 30.

Back plane 32 is configured of a sheet metal panel which is formed so as to have a pair of forwardly extending flange members 49a and 49b which are spaced apart a distance slightly greater than the width of the upper chassis 30. The depth of flange members 49a and 49b is approximately equal to the depth of upper chassis 30 horizontal flanges 35 and 36 so that when the chassis 30 is mated with the back plane 32, a void 50 (FIG. 2) is created between the back plane 32 and the chassis 30. Void 50 is not totally sealed because of the air passages 40 (shown in phantom in FIGS. 1 and 4) which are provided through the lower flange 36 of the upper chassis 30 and air passages 52 (FIG. 4) are provided through the upper chassis 30 above control electronics 29a.

Referring now to FIGS. 2 and 3, the inner chimney structure 26 is secured within enclosure 10, typically by welding the upper flange 35 of the upper chassis 30 to the undersurface of the top wall 12a so that the inner chimney structure serves as a backbone for the enclosure. When the inner chimney structure 26 is secured within the enclosure, the forward edge of the horizontal leg of the lower chassis 31 abuts the upper edge of the front wall 12f and the back plane 32 flanges 49a and 49b are contiguous with the inner surfaces of the side walls 12d and 12e. In this way the interior void of the enclosure 10 is divided into a forward compartment 53 and a rearward compartment 54. The forward compartment 53 may actually be thought of as the compartment within an enclosure whose top and side walls are formed by wall 12a and 12d and 12e, respectively, and whose back and bottom walls are formed by back plane 32 and the horizontal leg of lower chassis 31, respectively.

As best illustrated in FIGS. 2 and 3, supporting blocks 62 are situated between the undersurface of the horizontal leg of lower chassis 31 and the upper surface of enclosure wall 12b to support the inner chimney structure 26 within the enclosure. Each of the gussets 34 also rests on a support block 62 to form a solid base for the inner chimney structure. A lifting angle 56 is disposed through wall 12a and the upper flange 35 of the upper chassis 30 to facilitate lifting of the entire enclosure as well as to strengthen the attachment of the inner chimney structure 26 to the interior of the enclosure.

To achieve the greatest heat dissipation for the power electronic components 29 within the forward compartment 53 of the enclosure 10, each power electronic component 29 extends through an opening in the vertical leg of the lower chassis 31 for attachment to the sink pad of a heat sink 60 which itself is secured to the rearward exposed edge of the vertical leg of the lower chassis 31. In this way, each of the power electronic components 29 is located beneath passages 40 through flange 36 at the base of the void 50 of the interior chimney structure 26. Most of the heat given off by the power electronic component 29 (approximately 90%) is dissipated by heat sink 60 (described hereinafter) into the rearward compartment 54. The rearward compartment 54 of the enclosure is vented by way of openings 63 in the wall 12f and the openings 64 in the top enclosure 12a to create an outer chimney to duct air past the heat sink to achieve additional cooling.

The outer chimney increases the heat transfer away from the power electronic components 29 because heated air rising upwardly from the heat sinks 60 tends to create a draft, which sucks cool air through openings 63 and past the heat sinks 60.

The remainder of the heat dissipated by the power electronic components 29 (about 10%) rises upwardly through opening 40 in the chimney 26 and into the chimney void 50 where the heated air ultimately exits the inner chimney 26 through opening 52. In this way, the chimney structure 26 effectively serves to duct the heated air rising from the power electronic components 29 away from the control electronic 29a as well as from inductors 38 and capacitors 39' and power transistors 43. As may now be appreciated, mounting the inductors 38 and capacitors 39' so as to be forward of the area underlying opening 40 in the flanges 36 serves to keep the capacitors and inductors in the coolest part of the enclosure while keeping the lead lengths at a minimum.

The heated air rising through void 50 of the inner chimney 26 and exiting the chimney via opening 52 is cooled by the heat exchanger 28 and thus sinks along the heat exchanger until it ultimately reaches the components carried by the lower chassis 31 and sloping panel 42. This tends to create a natural air turbulence within the frontal compartment 53 of the enclosure. To better understand how the air within the inner compartment 53 is cooled by the heat exchanger 28, the construction of the heat exchanger will now be set forth below.

Referring now to FIG. 1, heat exchanger 28 generally takes the form of a corrugated sheet which is secured to the inner surface of door 16 either by welding, polymer bonding or by mechanical fasteners. The length of the corrugated sheet is as long as the length of door 16 so that the top and bottom ends of the corrugated sheet 28 extend through door frame and behind the face 21 at the top and bottom of the door. Referring now to FIGS. 1, 2 and 2a, the spacing between the edges of the corrugated sheet 28 and the door lip is sealed with caulk 65 so that no air enters the interior of enclosure 10 once door 16 is shut because the door is sealed around its perimeter by deforming gasket 20 overlying the enclosure lips 19. As best illustrated in FIG. 2a, the process of caulking is simplified by first installing a rubber gasket 66 between the corrugations of the exchanger 28 and the door 21. The gasket 66 is soft and flexible enabling it to conform to variations in the corrugated form and fit so as to effect a temporary seal. Liquid caulk 65 can then be easily poured in on top of the gasket to permanently seal the door.

When corrugated sheet 28 is secured to door 16 so that the upper and lower edges of the corrugated sheet are at least flush with the upper and lower door edges, a plurality of passageways 70 are created between the corrugations of sheet 28 and the interior surface of door 16 as illustrated in FIG. 3. Each of the passageways 70 is open to the outside atmosphere at the top and bottom of door 16 to carry ambient air therethrough. The passageways 70 act as a chimney structure to carry cooler air from the base of the door through the heat exchange to the top of the door, the cooler air tending to cool the surfaces of corrugated sheet 28 facing the enclosure interior become hotter near the top of the sheet than at the bottom. As the exposed surfaces of corrugated sheet 28 are cooled by the ambient air rising through passages 70, the heated air within the enclosure is cooled, increases in density, and sinks downwardly along the surfaces of the corrugated sheet exposed to the enclosure interior. This creates natural air turbulence within the interior 14 of enclosure 10. The natural air turbulence improves heat transfer through the door and cools the various electronic components within the enclosure.

The advantage of the above described cooling system is that air turbulence is created within the enclosure without the need for separate fans or blowers. The natural cooling system of the present invention could thus be left in an unattended location without any concern as to the component overheating due to failure of a fan or blower. Further, a system such as thus described, that works at low airflow rates will ingest dirt at a low rate and stay cleaner when there are long periods between maintenance calls.

Each of heat sinks 60, which are secured to the lower chassis 31 can take the form of a conventional well known extruded heat sink. However, a new improved staggered fin heat sink 60, illustrated in FIG. 5, was developed especially for the natural convection conditions present in the cooling system thus far described since the densely stacked, long, staggered fins of heat sinks 60 are only suitable in the slow air velocities found in a natural convection system. Referring to that figure, improved heat sinks 60 comprises a heat conductive plate 78 typically constructed of a metal pad made of aluminum or the like. A plurality of corrugated sections 80, each having a row of corrugations 82, are fastened to plate 78 with a small gap between each row to allow air to pass freely from section to section. The corrugated sections are offset or staggered so that each of the corrugations 82 of each corrugated section 80 is offset from adjacent corrugations of an adjacent corrugated section. However, the corrugated sections are arranged so that each of the corrugations of each section are in alignment with the corresponding corrugation of every other one of the corrugated sections secured to the pad. In practice, each of corrugated sections 80 is secured to plate 78 by braising so that each of the corrugations 82 of each corrugated section 80 is offset from an adjacent corrugation by an amount equal to one-half the spacing between corrugations so that the fins in each section are centered in the air passages of adjacent sections.

Figure 5:
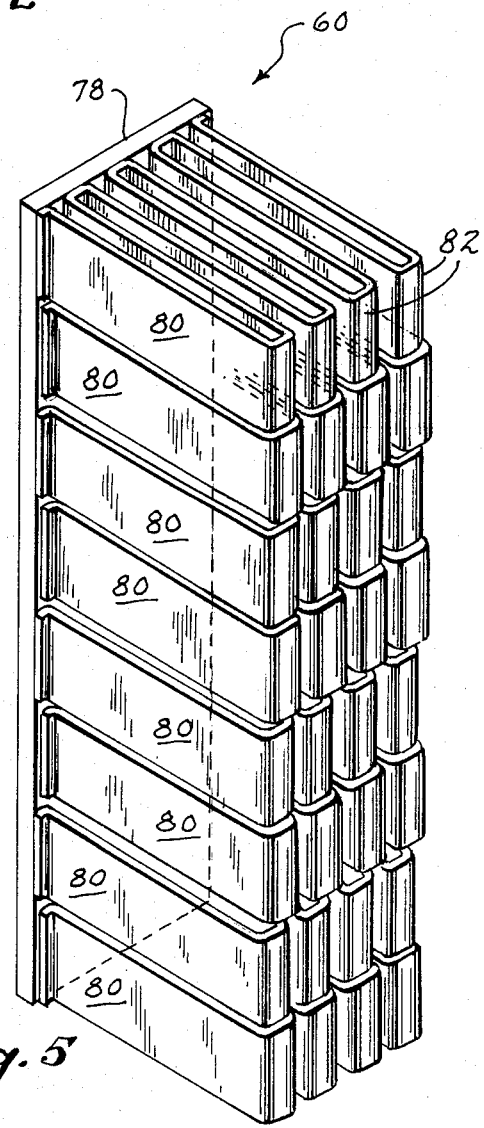
FIG. 5 is a perspective view of the corrugated, stagger fin heat sink of the cooling system of FIG. 1.

The staggered fin corrugated heat sink 60 illustrated in FIG. 5 has several advantages over conventional extruded heat sinks. Firstly, by staggering the individual corrugations of each corrugated section from the corrugations of each adjacent corrugated section, the leading edge of each corrugation 82 of each corrugated section 80 lies within the air channel bounded by the corrugations of an adjacent corrugated section. This creates a large number of "leading edges" and tends to increase the air turbulence across the surfaces of the corrugation. Thus, the full effect of "leading edge efficiency", that is, the increased air turbulence and air diverted across the corrugation surfaces by the leading edge of the corrugation, occurs along the entire length of the sink rather than at just the bottom of a conventional extruded heat sink. Moreover, the corrugations 82 of each corrugated section can be made longer and closer than the fins of a conventional extruded heat sink because of practical limits in extrusion tooling.

Referring now to FIG. 2, the greatest heat dissipation is achieved when power electronic components 29 are spaced apart on plate 78 of heat sink 60 so that the power electronic components 29 in alignment with the bottom most corrugations of heat sink 60 are spaced closer together. Conversely, the power electronic compenents 29 mounted parallel to the upper corrugated sections of the heat sink 60 are spaced further apart. This is because the air rising past the upper corrugated sections 80 secured to plate 78 of heat sink 60 tends to be warmer than the air rising past the lower corrugated sections 80 of the heat sink. Thus the uppermost corrugated sections of the heat sink dissipate heat with less efficiency than those at the bottom of the heat sink so a larger number of corrugated sections are required to dissipate the heat of those power electronic compenents 29 mounted adjacent to the upper end of the heat sink.

The foregoing discloses an improved convection cooling system for naturally convectively cooling power carrying electronic components thereby obviating the need for mechanical air handling equipment such as fans or blowers while protecting the devices within a sealed enclosure. In particular, this is a system of functional elements coordinated to take optimum advantage of the conditions of controlled natural air convection to boost circulation and improve cooling. The system provides for protection of sensitive electronic components by wrapping them in a sealed enclosure to keep them clean and by directing hot air drafts away from them to keep them cool.

While only certain preferred features of the invention have been shown by way of illustration, many modifications and changes will occur to those skilled in the art. It is therefore to be understood that the appended claims are intended to cover all such modifications and changes as fall within the true spirit of the invention.

What is claimed is:

1. A convection cooling system which houses electronic components, said system comprising:
   a housing which defines a cavity and which includes a door that may be opened to gain access to the cavity;
   a chassis base secured within said housing near its bottom, the chassis base supporting said electronic components;
   an inner chimney secured within said housing and mounted to the top of said chassis base so that the chassis base and the inner chimney divide the cavity into a forward compartment and a rearward compartment, said inner chimney ducting the air heated by the electronic components upward through a chimney void to the top of the forward compartment of said housing, thereby creating an upward draft in the chimney void which forces a downward air circulation within the forward compartment of said housing; and
   a heat exchanger providing a cool surface exposed to the interior of said forward compartment so that the heated air at the top of said forward compartment flows downwardly along said heat exchanger cooled surface to the bottom of said housing.

2. The invention according to claim 1 further including:
   a heat sink mounted to said chassis base so that the heat sink extends rearwardly therefrom into said rearward compartment, the heat sink acting to carry a portion of the heat dissipated by each electronic component into said rearward compartment and away from said forward compartment;
   an air passageway formed on the bottom of the housing and extending from the front of the housing to the bottom of said rearward compartment; and
   an air opening formed through the top of said rearward compartment to create an outer chimney through said rearward compartment.

3. The invention according to claim 1 wherein: said chassis base further includes a pair of attached gussets secured thereof providing additional rigidity thereto; and
   a sloping panel which fastens to and extends between the gussets diverting heated air rising from the electronic components into said chimney void.

4. The cooling system as recited in claim 1 wherein the inner chimney comprises:
- a pair of upright walls which are spaced apart to form the chimney void; and
- a lower flange which connects the bottom edges of each upright wall and which includes an air inlet positioned above the electronic components supported by said chassis base.

5. The invention according to claim 2 in which the heat sink includes a substantially vertical heat conductive plate with a plurality of fins attached thereto and extending rearward therefrom,
- the fins being arranged into a plurality of rows disposed one above the other, with the fins in adjacent rows being laterally offset from each other.

6. The invention according to claim 5 in which each row of fins is formed by a strip of corrugated heat conductive material.

7. An enclosure which includes heat producing electronic components which comprises:
- a housing which defines a cavity, and a door that may be opened to gain access to the cavity; said cavity including an upright back plane;
- inner chimney means formed by an upright wall and said upright back plane spaced from said upright wall; said inner chimney means mounted within the housing to divide the cavity into a forward compartment and a rearward compartment which connect to each other at both the top and the bottom of the upright wall;
- a heat exchanger secured to the housing and providing a cooling surface exposed to the forward compartment which cools heated air at the top of the forward compartment and establishes a downward air flow therein; and
- mounting means connected to the housing and positioned at the bottom of the upright wall, the mounting means supporting the electronic components which provide a heating surface that heats air at the bottom of the rearward compartment and establishes an upward air flow therein.

8. The enclosure as recited in claim 7 in which the heat exchanger is mounted to the door and includes a corrugated sheet that defines upright air passages on the outer surface thereof which convey ambient air therethrough, and the inner surface thereof forms said cooling surface.

* * * * *